United States Patent
Liu et al.

(10) Patent No.: US 11,747,372 B2
(45) Date of Patent: Sep. 5, 2023

(54) DIFFERENTIAL-SIGNAL-DETECTION CIRCUIT

(71) Applicant: NXP USA, Inc., Austin, TX (US)

(72) Inventors: Xiaoqun Liu, Chandler, AZ (US); Siamak Delshadpour, Phoenix, AZ (US)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 17/449,776

(22) Filed: Oct. 1, 2021

(65) Prior Publication Data

US 2023/0103334 A1  Apr. 6, 2023

(51) Int. Cl.
| | |
|---|---|
| G01R 31/66 | (2020.01) |
| G01R 19/165 | (2006.01) |
| G01R 19/10 | (2006.01) |
| H03K 5/24 | (2006.01) |

(52) U.S. Cl.
CPC ....... *G01R 19/16566* (2013.01); *G01R 19/10* (2013.01); *G01R 31/66* (2020.01); *H03K 5/24* (2013.01)

(58) Field of Classification Search
CPC .............. G01R 29/0821; G01R 31/001; G01R 31/2284; G01R 31/2829; G01R 17/10; H05K 9/0069; H03K 5/086; H03K 5/22; H03K 5/24; H03K 5/1252; H03K 5/2472
See application file for complete search history.

(56) References Cited

U.S. PATENT DOCUMENTS

| | | | |
|---|---|---|---|
| 9,319,041 B1 | 4/2016 | Wang et al. | |
| 9,360,505 B1 | 6/2016 | Wang et al. | |
| 9,490,791 B2 | 8/2016 | Liu et al. | |
| 10,432,432 B1 | 10/2019 | Liu et al. | |
| 10,594,285 B1 | 3/2020 | Delshadpour et al. | |
| 2007/0030035 A1 | 2/2007 | Komatsu et al. | |
| 2008/0165902 A1 | 7/2008 | Moriwaki | |
| 2012/0015617 A1 | 1/2012 | Srivastava et al. | |
| 2013/0229294 A1* | 9/2013 | Matsuno ................. | H03M 1/12 341/155 |
| 2013/0307525 A1* | 11/2013 | Chen ....................... | H04L 49/90 324/101 |
| 2014/0111248 A1* | 4/2014 | Kumar ..................... | H04B 3/46 327/97 |
| 2015/0067209 A1* | 3/2015 | Liu ......................... | H03K 5/156 710/106 |

(Continued)

OTHER PUBLICATIONS

"Embedded USB2 (eUSB2) Physical Layer Supplement to the USB Revision 2.0 Specification, Revision 1.1"; 158 pages (2018).

(Continued)

*Primary Examiner* — Thang X Le (57) ABSTRACT

One example discloses a differential-signal-detection circuit, comprising: an input stage configured to receive a differential input signal and to output a first differential output signal and a second differential output signal; a first comparator coupled to receive the first differential output signal and generate a first comparator output signal; a second comparator coupled to receive the second differential output signal and generate a second comparator output signal; and an output stage configured to receive the first and second comparator output signals and generate a differential-signal-detection signal.

17 Claims, 4 Drawing Sheets

(56) References Cited

U.S. PATENT DOCUMENTS

2016/0322965 A1* 11/2016 Elran ................ H03K 5/24
2018/0183422 A1   6/2018 Yasotharan et al.
2019/0198068 A1   6/2019 Sreeramaneni et al.
2020/0052684 A1*  2/2020 Huang .............. H03K 19/003

OTHER PUBLICATIONS

Kawar, Sanad et al; "A 10 Gbps Loss of Signal Detector for High-Speed AC-Coupled Serial Transceivers in 28nm CMOS Technology"; IEEE International Conference on IC Design & Technology Conference Papers; 4 pages (2014).

Walker, R. et al; "A 2.488Gb/s Si-Bipolar Clock and Data Recovery IC with Robust Loss of Signal Detection"; International Solid-State Conference, Session 15, Serial Data Communications, Paper EP 15.5; 3 pages (1997).

U.S. Appl. No. 16/933,643; not yet published; 18 pages (filed Jul. 20, 2020).

U.S. Appl. No. 17/452,413; Notice of Allowance; 8 pages (dated May 4, 2022).

U.S. Appl. No. 17/452,413; not yet published; 37 pages (filed Oct. 27, 2021).

* cited by examiner

DIFFERENTIAL-SIGNAL-DETECTION CIRCUIT

The present specification relates to systems, methods, apparatuses, devices, articles of manufacture and instructions for detecting differential signals.

SUMMARY

According to an example embodiment, a differential-signal-detection circuit, comprising: an input stage configured to receive a differential input signal and to output a first differential output signal and a second differential output signal; a first comparator coupled to receive the first differential output signal and generate a first comparator output signal; a second comparator coupled to receive the second differential output signal and generate a second comparator output signal; and an output stage configured to receive the first and second comparator output signals and generate a differential-signal-detection signal.

In another example embodiment, the input stage includes a first path having a first node and a second node, and a second path having a third node and a fourth node.

In another example embodiment, the second differential output signal is generated from the second node and the fourth node; and the first differential output signal is generated from the first node and the fourth node.

In another example embodiment, a first resistance is between the first node and the second node; and a second resistance is between the third node and the fourth node.

In another example embodiment, the first and second resistances are equal.

In another example embodiment, the first and second resistances are variable in response to a controller signal.

In another example embodiment, a first current source is coupled to the second node; and a second current source is coupled to the fourth node.

In another example embodiment, the first and second current source currents are equal.

In another example embodiment, the first and second current source currents are variable in response to a controller signal.

In another example embodiment, the first resistance and the first current source are configured to set a first threshold voltage; and if the differential input signal is greater than the first threshold voltage, then the differential-signal-detection signal is generated by the output stage.

In another example embodiment, the first resistance and the first current source are configured to set a first threshold voltage; the second resistance and the second current source are configured to set a second threshold voltage; and if the differential input signal is greater than either the first or second threshold voltages, then the differential-signal-detection signal is generated by the output stage.

In another example embodiment, the first threshold voltage=$(n*Vbg/R)*R1$; $(n*Vbg/R)$=the first current source current and R1=the first resistance; and "n" is a variable integer, Vbg is an bandgap reference voltage, R is an internal equivalent resistance of the first current source.

In another example embodiment, the first threshold voltage and the second threshold voltage are equal.

In another example embodiment, the first threshold voltage and the second threshold voltage are different.

In another example embodiment, the circuit is embedded in a squelch-detector; and the differential-signal-detection signal logic-high corresponds to an un-squelched state, and the differential-signal-detection signal logic-low corresponds to an squelched state.

In another example embodiment, the circuit is embedded in a disconnect-detector; and the differential-signal-detection signal logic-high corresponds to a connected state, and the differential-signal-detection signal logic-low corresponds to a disconnected state.

In another example embodiment, a third current source is coupled to the first node; and a fourth current source is coupled to the third node.

In another example embodiment, a first transistor is coupled to the first node and a first end of the differential input signal; and a second transistor is coupled to the third node and a second end of the differential input signal.

In another example embodiment, the circuit is embedded in a repeater-circuit; and the differential input signal is either an eUSB or USB signal.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

USB (e.g. v2.0) has been one of the most successful wired interfaces in the past 20 years, and almost all SoCs today are equipped with a USB 2.0 interface. USB standards evolution kept the original 3.3V I/O USB 1.0 interface intact for backward compatibility, helping enable wider adoption and a larger ecosystem while also preserving device interoperability. However, as process nodes approach more advanced node (e.g. 5 nm), the manufacturing cost to maintain USB 2.0 3.3V I/O signaling has grown exponentially.

Embedded USB2 (eUSB2) is a supplement specification to the USB 2.0 specification that addresses issues related to interface controller integration with advanced system-on-chip (SoC) process nodes by enabling USB 2.0 interfaces to operate at I/O voltages of 1V or 1.2V instead of 3.3V. eUSB2 can enable smaller, more power-efficient SoCs, in turn enabling process nodes to continue to scale while increasing performance in applications such as smartphones, tablets and notebooks. In some examples, designers integrate the eUSB2 interface at a device level while leveraging and reusing the USB 2.0 interface at a system level. eUSB2 can support onboard inter-device connectivity through direct connections as well as exposed connector interfaces through an eUSB2-to-USB 2.0 repeater.

Figure 1A:
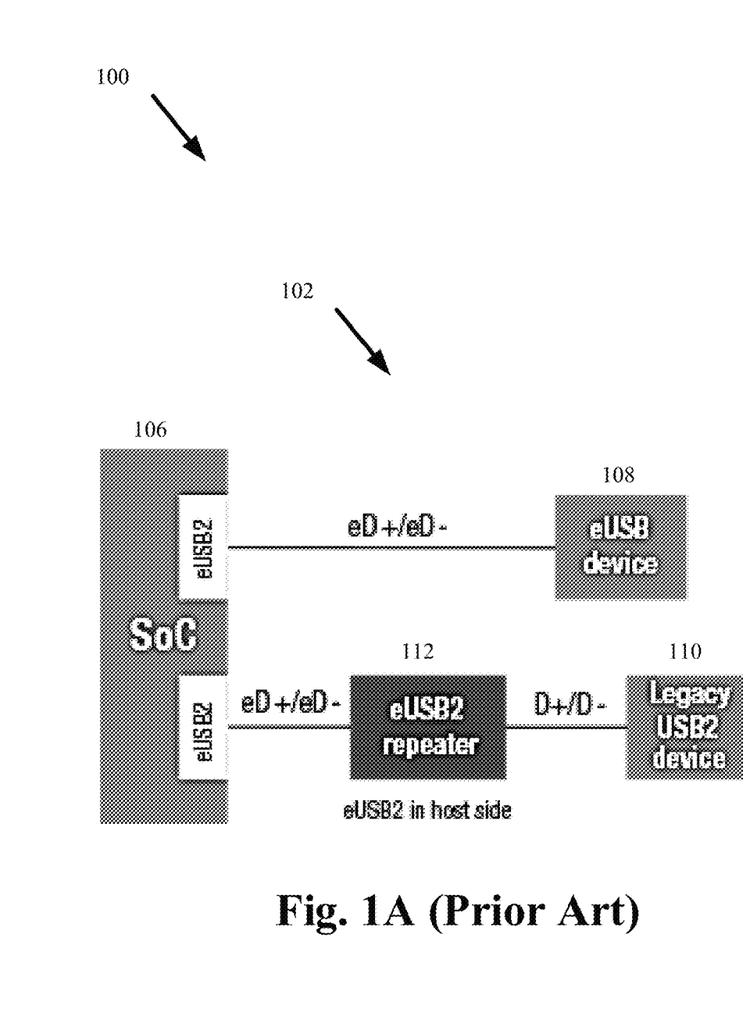
FIGS. 1A and 1B represents examples of two eUSB/USB configurations requiring differential-signal-detection.
Figure 1B:
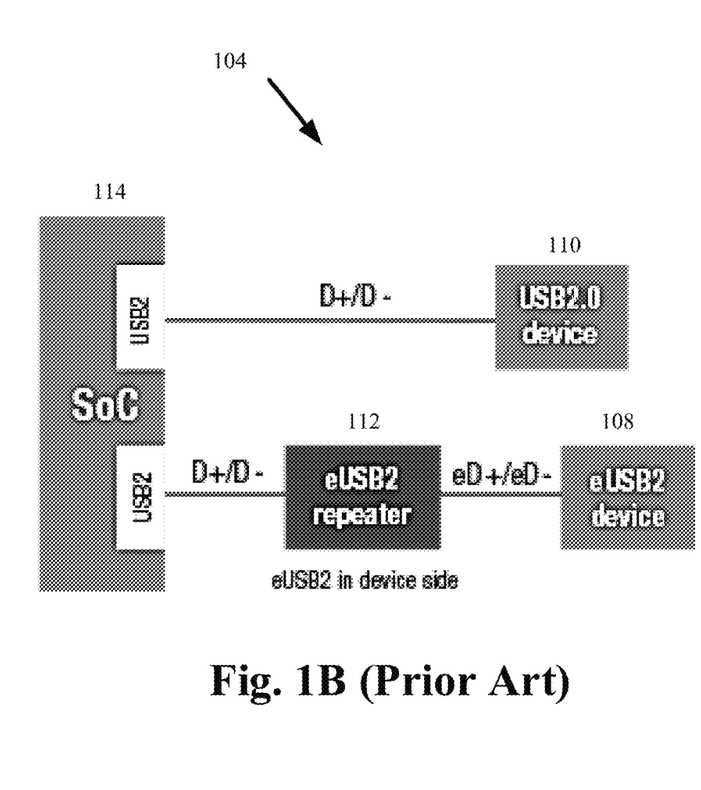

FIGS. 1A and 1B represents examples 100 of two eUSB/USB configurations 102, 104 requiring differential-signal-detection.

The first configuration 102 includes a system on a chip (SoC) having two eUSB embedded interfaces (as shown). The chip 106 is configured to be coupled to an external eUSB device 108 and to a legacy USB2 device 110. An eUSB2 repeater 112 is necessary to convert a differential eUSB signal (eD+/eD−) to a differential USB signal (D+/D−). The eUSB2 repeater 112 in some examples is on a same PC board as the chip 106, while the eUSB 108 and USB 110 devices are coupled via cabling.

The second configuration 104 is substantially similar to the first configuration 102, except now an SoC 114 includes two USB2 embedded interfaces (as shown).

The eUSB/USB circuits 106, 108, 110, 112, 114 in various example embodiments require differential-signal-detection of some sort, either for squelch detection, disconnect detection, or for some other reason. For example, in some eUSB/USB2 bidirectional high-speed repeaters, squelch detectors in both eUSB and USB2 sides are required, and a disconnect detector in the USB2 side is required.

The squelch detectors can be used to wake high-speed receivers within these circuits 106, 108, 110, 112, 114 from a power-saving mode when communications activity is detected from another USB device. For example, when the USB2 to eUSB path is needed, the USB2 SQD will be enabled and the repeater will be enabled after detection of incoming signal by USB2 SQD. When the eUSB to USB2 path is needed, the eUSB SQD will be enabled and the repeater will be enabled after detection of incoming signal by eUSB SQD.

Squelch detectors can also be used to indicate whether communications data is invalid, such as when an amplitude of a received differential signal falls below a fixed squelch threshold.

After these circuits 106, 108, 110, 112, 114 are enabled and using the communications channel to exchange data with other devices, the disconnect detector (DCD) can be used to detect any absence, disconnect, or detached peripheral device during active channel use. Disconnect detection may also be required within downstream facing ports for detecting the disconnect state on the line.

These differential-signal-detection circuits (e.g. squelch detectors and disconnect detectors) are often uniquely designed and tailored to their particular application (e.g. squelch, disconnect, etc.).

For example, the eUSB standards specification defines a typical eUSB squelch detector threshold to be 85 mV and the USB2 standards specification defines the typical USB2 squelch detector threshold to be 125 mV. However, in many squelch detector designs, customization may be required to have wide range of programmability on detection threshold, for example, to cover as low as 50 mV or lower, and as high as 160 mV or higher.

Similarly, the USB2 standards specification defines the typical USB2 disconnection detector threshold to be 575 mV, and customization may require a wide range of programmability on detection threshold (e.g. disconnection must be indicated when the amplitude of the differential signal at the downstream facing driver's connector is >/=625 mV, and it must not be indicated when the signal amplitude is </=525 mV).

Now discussed are various programmable differential-signal-detection circuits that, using a same design, not only can be programmed as either a squelch detector, a disconnect detector, or some other signal-detection device, but also to operate at various thresholds and voltages. This wide range of programmability makes the programmable differential-signal-detection architecture suitable for many applications using a common circuit design.

Figure 2:
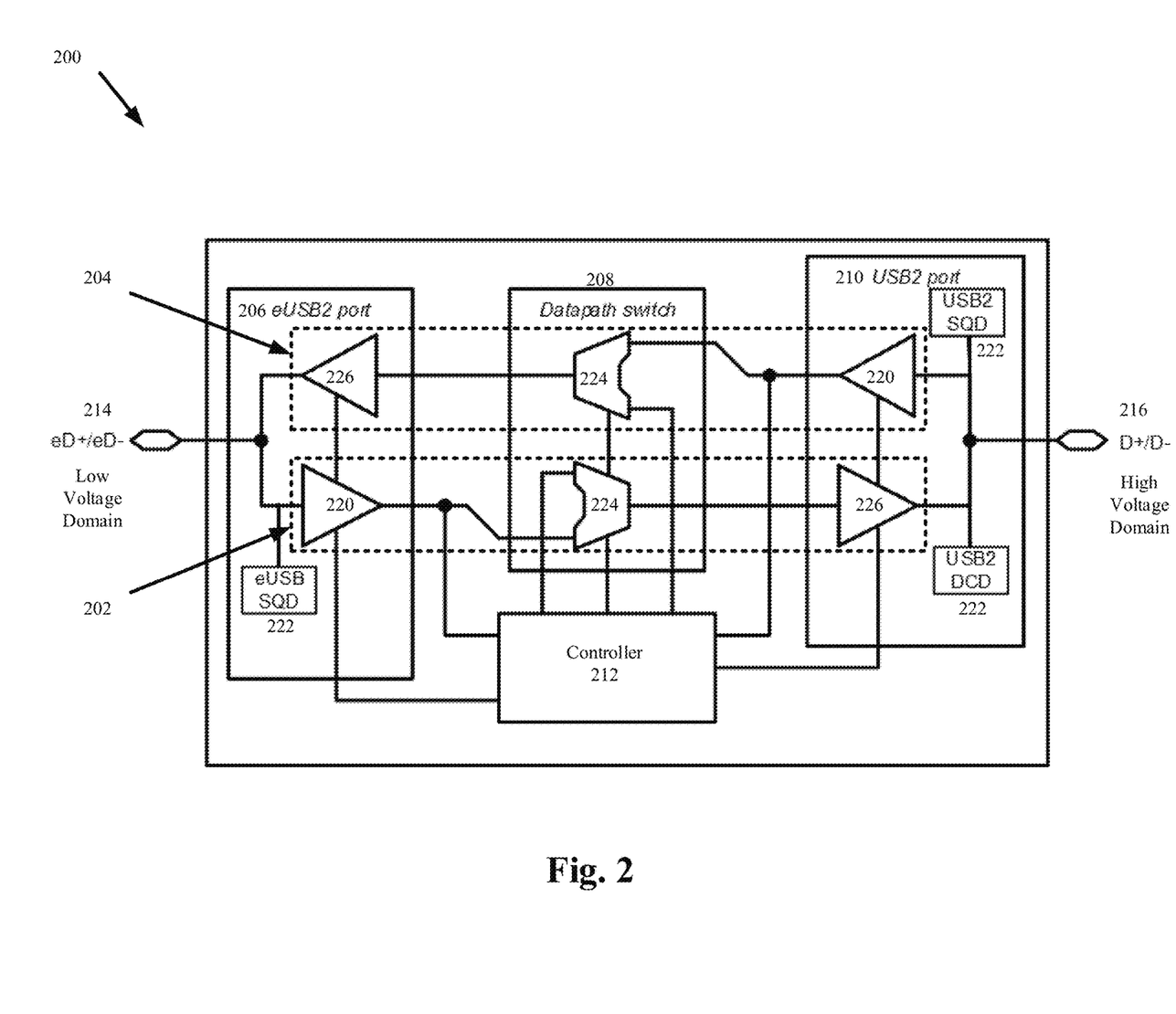
FIG. 2 is an example bi-directional eUSB/USB repeater including a set of programmable differential-signal-detection circuits.

FIG. 2 is an example 200 bi-directional eUSB/USB repeater including a set of programmable differential-signal-detection circuits 222. This example repeater follows the first configuration 102 example in FIG. 1A, but in another example embodiment could follow the second configuration 104 in FIG. 1B.

The repeater 200 includes a transmit datapath 202, a receive datapath 204, an eUSB2 port 206, a datapath switch matrix 208, a USB2 port 210, and a controller 212. The repeater 200 is configured to be coupled to differential eUSB signals (eD+/eD−) 214 in a low voltage domain, and differential USB signals (D+/D−) 216 in a high voltage domain. In various example embodiments, a 1.8V Vdd powers the eUSB port 206 and a 3.3V Vdd powers the USB2 port 210.

The transmit and receive datapaths 202, 204 are substantially similar and include: a slicer 220, a datapath switch 224, and a line-driver 226. The datapaths 202, 204 in various embodiments also include (not shown) a continuous time linear equalizer (CTLE), a feed forward equalizer (FFE) for removing most intersymbol interference (ISI), input and termination resistors (RT). RT can be different for different standards (e.g. for an USB2 to an eUSB repeater, input RT=45Ω, output RT=40Ω).

The slicer 220 makes a (non-linear) hard decision and makes the data signal either high or low, which avoids propagation of amplitude noise and allows regeneration of pre-emphasis. The data signal after the slicer 220 and before the line driver 226 is in either the lower voltage domain (e.g. 1.8V) or the high voltage domain (e.g. 3.3V), depending upon the datapath 202, 204.

As shown, the eUSB2 port 206 includes one of the programmable differential-signal-detection circuits 222 configured as an eUSB squelch detector (SQD). Also as shown, the USB2 port 210 includes two programmable differential-signal-detection circuits 222, one configured as a USB2 squelch detector (SQD) and one configured as a USB2 disconnect detector (DCD) as shown.

Now discussed are various example embodiments of the differential-signal-detection circuits 222. In other example embodiments, the differential-signal-detection circuits to be discussed can be used in any communication circuit that requires differential-signal-detection of some sort, perhaps for squelch detection and disconnect detection, but also for other reasons.

Figure 3:
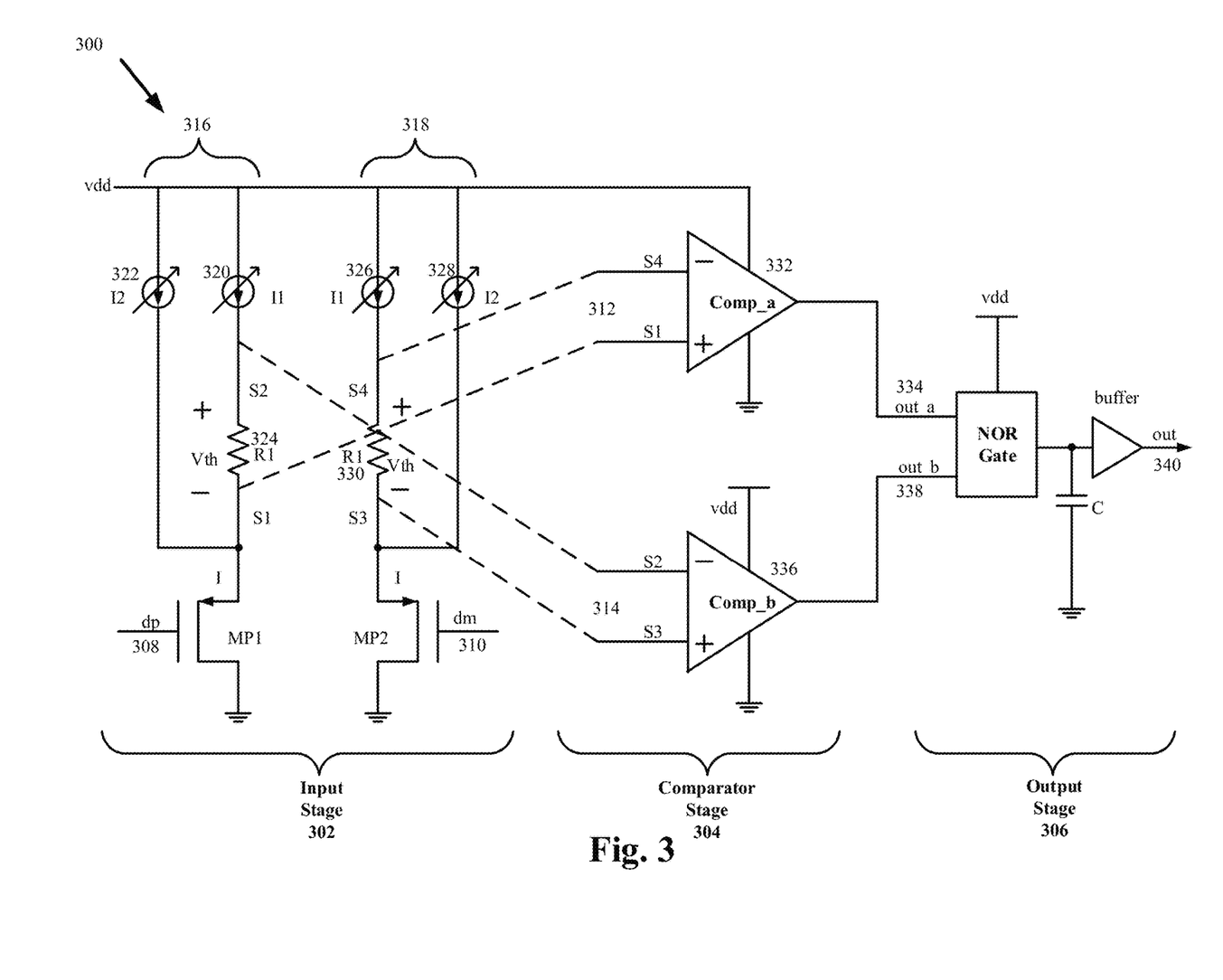
FIG. 3 is a first example programmable differential-signal-detection circuit.

FIG. 3 is a first example programmable differential-signal-detection circuit 300. The differential-signal-detection circuit 300 includes: an input stage 302, a comparator stage 304, and an output stage 310.

The input stage 302 is configured to receive differential input signal 308, 310 (dp (data-plus input) and dm (data-minus input)) and generate a first differential output signal 312 and a second differential output signal 314.

The input stage 302 includes a first path 316 and a second path 318. The first path 316 includes a detection current source (I1) 320, a compensation current source (I2) 322, a resistance (R1) 324, and a transistor (MP1). The second path 318 includes a detection current source (I1) 326, a compensation current source (I2) 328, a resistance (R1) 330, and a transistor (MP2). Transistors MP1 and MP2 are shown as PMOS, but could be NMOS or of another type in a circuit which follows the same design principals.

The comparator stage 304 includes a first comparator 332 configured to receive the first differential output signal 312 and generate a first single-ended output signal 334, and a second comparator 336 configured to receive the second differential output signal 314 and generate a second single-ended output signal 338.

The output stage 306 is configured to receive the first and second single-ended output signals 334, 338 and generate a differential-signal-detection signal at an output 340. The output stage 306 includes a NOR gate, a capacitor, and an inverter. In some example embodiments, the output stage 310 inverter is sized for driving additional circuits (not shown), but in other example embodiments may be omitted.

The detection threshold voltage (Vth) across R1 324, 330 in each path 316, 318 results from the detection current source I1 320, 326 current passing through these resistances R1 324, 330.

The detection threshold voltage "Vth=(n*Vbg/R)*R1", where "n" is a variable integer, Vbg is an bandgap reference voltage, R is an internal equivalent resistance of the current source (I1) 320, 326, and R1 is a circuit resistance as shown.

The ratio R1/R in some example embodiments is constant, and the controller 212 varies the detection threshold voltage (Vth) by changing the value of "n". However, in other example embodiments, the controller 212 can vary the detection threshold voltage (Vth) by changing another variable (i.e. see FIG. 4).

MP1 and MP2 provide voltage level shifting. That is, a voltage at node "S1=dp+Vsg", and a voltage at node "S3=dm+Vsg", where "Vsg=abs(Vthp)+sqrt(2*I/(μp*Cox*(W/L)))". Where μp is the mobility of the transistor, and Cox is the gate oxide capacitance per unit area of the transistor, and W is the channel width while L is the channel length of the transistor.

The differential-signal-detection signal is generated at the output 340 if an absolute value (abs) of the differential input signal's 308, 310 amplitude exceeds the detection threshold voltage (Vth) (i.e. "dp−dm>Vth", or "dm−dp>Vth").

In some example embodiments, if "dp−dm>Vth", then the voltage at node S1 is higher than a voltage at node S4, and out_a 334 from comparator 332 is logic high ("1") such that the NOR gate in the output stage 306 sets the output 340 to a logic low ("0"). This means that the differential input signal is un-squelched.

Similarly, if "dm−dp>Vth", then the voltage at node S3 is higher than a voltage at node S2, and out_b 338 from comparator 336 is logic high ("1) and the NOR gate in the output stage 306 sets the output 340 to logic low ("0"). This similarly means that the differential input signal is un-squelched.

However, if the differential input signal amplitude is lower than the detection threshold voltage (Vth) (i.e. "dp−dm<Vth", or "dm−dp<Vth"), then the voltage at node S1 is lower than the voltage at node S4, and the voltage at node S3 is lower than the voltage at node S2 such that both out_a 334 and out_b 338 are logic low such that the NOR gate sets the output 340 to a logic high ("1"). This means the input signal is squelched.

Voltage S1 can be written as:

$$S1 = dp + Vsg = dp + abs(Vthp) + sqrt(2*I/(\mu p*Cox*(W/L))) + Vth.$$

Voltage S3 can be written as:

$$S3 = dm + Vsg = dm + abs(Vthp) + sqrt(2*I/(\mu p*Cox*(W/L))) + Vth.$$

Voltage S2 can be written as:

$$S2 = dp + Vsg = dp + abs(Vthp) + sqrt(2*I/(\mu p*Cox*(W/L))) + Vth.$$

Voltage S4 can be written as:

$$S4 = dm + Vsg = dm + abs(Vthp) + sqrt(2*I/(\mu p*Cox*(W/L))) + Vth.$$

Since the differential input signal (i.e. dp and dm) in some example embodiments has a very wide common mode voltage (e.g. from −50 mV to 500 mV in eUSB specs and USB2 specs); and the absolute value (abs) of Vth can also vary across PVT and therefore, S1, S2, S3 and S4 can also have a wide range of common mode voltage; in some example embodiments, the input stage 316 and 318 also includes the compensation current sources (I2) 322, 328.

Using the compensation current sources (I2) 322, 328: first, avoids the comparator comp_a 332 and comp_b 336 being impacted by the wide common mode voltage of S1, S2, S3 and S4; second, maintains enough operation headroom of the detection current sources (I1) 320, 326; and third avoids addition variation on "sqrt(2*I/(μp*Cox*(W/L)))".

In some example embodiments, the compensation current sources (I2) 322, 328 currents are equal to "(m−n)*Vbg/R", where "m" is a constant number determined by a particular design application and "n" is programmable, as previously described.

The compensation current sources (I2) 322, 328 ensure that a current I (as shown in FIG. 3), going through MP1 and MP2 is constant regardless of different detection threshold voltage (Vth) settings.

Current I can be achieved as: I=I1+I2=(m−n)*Vbg/R+ n*Vbg/R=m*Vbg/R.

Which results in: sqrt(2*I/(μp*Cox*(W/L)))=sqrt(2* (m*Vbg/R)/(μp*Cox*(W/L))).

Thus the differential-signal-detection circuit has a wide detection threshold programmability.

Figure 4:
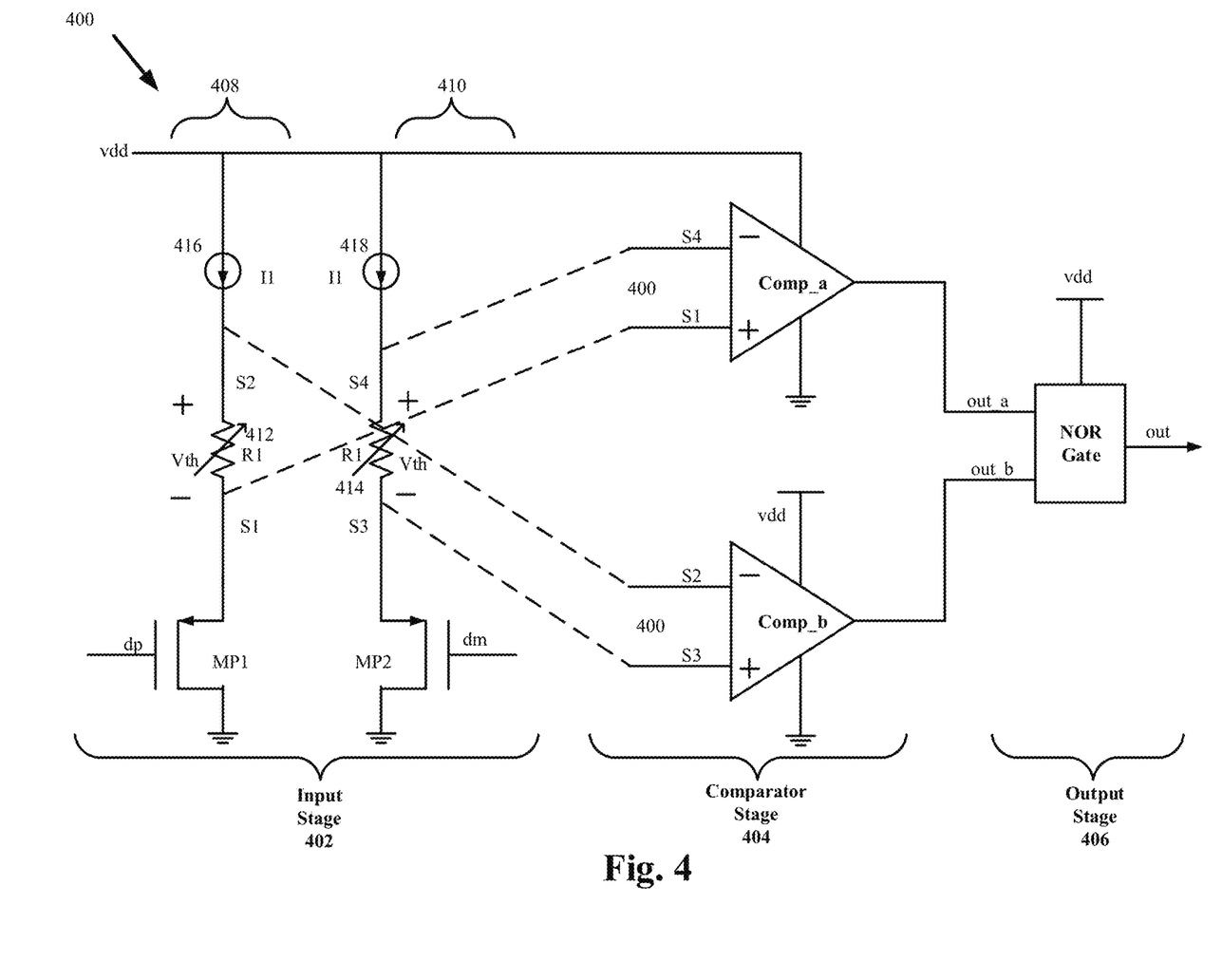
FIG. 4 is a second example programmable differential-signal-detection circuit.

FIG. 4 is a second example programmable differential-signal-detection circuit 400. The differential-signal-detection circuit 400 includes: an input stage 402, a comparator stage 404, and an output stage 410. The second example programmable differential-signal-detection circuit 400 is substantially the same as the first example programmable differential-signal-detection circuit 300, but with the following changes.

First, in both a first path 408 and a second path 410 of the input stage 402 of the second circuit 400, resistances (R1) 412, 414 are variable and can be changed by the controller 212 to vary the detection threshold voltage (Vth) since Vth=I1*R1.

Second, also in both a first path 408 and a second path 410 of the input stage 402 of the second circuit 400, there is only detection current sources (I1) 416, 418.

In some example embodiments, varying resistances (R1) 412, 414 will include switches which can have parasitic resistance and affect an accuracy of R1, that in turn can affect an accuracy of the detection threshold voltage (Vth). Such switches may also have a parasitic capacitance that can affect the differential-signal-detection circuit's 400 operational speed.

The example programmable differential-signal-detection circuits 300, 400 just discussed can in various example embodiments be used as either squelch detectors and/or disconnect detectors for any circuit having differential signals. The circuits 300, 400 can also be used in various USB2 and eUSB applications, as well as in any other communication circuits/standards that need wide range detection threshold programmability. The circuits 300, 400 in some example applications can be used in bi-directional repeaters, logic converters, or other signal processing applications.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transitory computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transitory machine or computer-usable media or mediums as defined herein excludes signals, but such media or mediums may be capable of receiving and processing information from signals and/or other transitory mediums.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A differential-signal-detection circuit, comprising:
an input stage configured to receive a differential input signal and to output a first differential output signal and a second differential output signal;
a first comparator coupled to receive the first differential output signal and generate a first comparator output signal;
a second comparator coupled to receive the second differential output signal and generate a second comparator output signal; and
an output stage configured to receive the first and second comparator output signals and generate a differential-signal-detection signal;
wherein the input stage includes a first path having a first node and a second node, and a second path having a third node and a fourth node;
wherein a first resistance is between the first node and the second node;
wherein a second resistance is between the third node and the fourth node;
wherein a first current source is coupled to the second node;
wherein a second current source is coupled to the fourth node;
wherein the first resistance and the first current source are configured to set a first threshold voltage; and
wherein if the differential input signal is greater than the first threshold voltage, then the differential-signal-detection signal is generated by the output stage.

2. The circuit of claim 1:
wherein the second differential output signal is generated from the second node and the third node; and
wherein the first differential output signal is generated from the first node and the fourth node.

3. The circuit of claim 1:
wherein the first and second resistances are equal.

4. The circuit of claim 1:
wherein the first and second resistances are variable in response to a controller signal.

5. The circuit of claim 1:
wherein the first and second current source currents are equal.

6. The circuit of claim 1:
wherein the first and second current source currents are variable in response to a controller signal.

7. The circuit of claim 1:
wherein the first resistance and the first current source are configured to set the first threshold voltage;
wherein the second resistance and the second current source are configured to set a second threshold voltage; and
wherein if the differential input signal is greater than either the first or second threshold voltages, then the differential-signal-detection signal is generated by the output stage.

8. The circuit of claim 1:
wherein the first threshold voltage=(n*Vbg/R)*R1;
wherein (n*Vbg/R)=the first current source current and R1=the first resistance; and
wherein "n" is a variable integer, Vbg is an bandgap reference voltage, R is an internal equivalent resistance of the first current source.

9. The circuit of claim 7:
wherein the first threshold voltage and the second threshold voltage are equal.

10. The circuit of claim 7:
wherein the first threshold voltage and the second threshold voltage are different.

11. The circuit of claim 1:
wherein the circuit is embedded in a squelch-detector; and
wherein the differential-signal-detection signal logic-high corresponds to an un-squelched state, and the differential-signal-detection signal logic-low corresponds to an squelched state.

12. The circuit of claim 1:
wherein the circuit is embedded in a disconnect-detector; and
wherein the differential-signal-detection signal logic-high corresponds to a connected state, and the differential-signal-detection signal logic-low corresponds to a disconnected state.

13. The circuit of claim 1:
wherein a third current source is coupled to the first node; and
wherein a fourth current source is coupled to the third node.

14. The circuit of claim 1:
wherein a first transistor is coupled to the first node and a first end of the differential input signal; and
wherein a second transistor is coupled to the third node and a second end of the differential input signal.

15. The circuit of claim 1:
wherein the circuit is embedded in a repeater-circuit; and
wherein the differential input signal is either an eUSB or USB signal.

16. A differential-signal-detection circuit, comprising:
an input stage configured to receive a differential input signal and to output a first differential output signal and a second differential output signal;
a first comparator coupled to receive the first differential output signal and generate a first comparator output signal;
a second comparator coupled to receive the second differential output signal and generate a second comparator output signal; and
an output stage configured to receive the first and second comparator output signals and generate a differential-signal-detection signal;
wherein the input stage includes a first path having a first node and a second node, and a second path having a third node and a fourth node;
wherein a first resistance is between the first node and the second node;
wherein a second resistance is between the third node and the fourth node;
wherein a first current source is coupled to the second node;
wherein a second current source is coupled to the fourth node;
wherein a third current source is coupled to the first node; and
wherein a fourth current source is coupled to the third node.

17. An eUSB to USB repeater-circuit, comprising:
a differential-signal-detection circuit;
wherein the differential-signal-detection circuit includes,
an input stage configured to receive a differential input signal and to output a first differential output signal and a second differential output signal;
a first comparator coupled to receive the first differential output signal and generate a first comparator output signal;
a second comparator coupled to receive the second differential output signal and generate a second comparator output signal; and
an output stage configured to receive the first and second comparator output signals and generate a differential-signal-detection signal;
wherein the input stage includes a first path having a first node and a second node, and a second path having a third node and a fourth node;
wherein a first resistance is between the first node and the second node;
wherein a second resistance is between the third node and the fourth node;
wherein a first current source is coupled to the second node;
wherein a second current source is coupled to the fourth node;
wherein the first resistance and the first current source are configured to set a first threshold voltage;
wherein if the differential input signal is greater than the first threshold voltage, then the differential-signal-detection signal is generated by the output stage; and
wherein the differential input signal is either an eUSB or USB signal.

* * * * *